(12) United States Patent
Liff et al.

(10) Patent No.: US 10,658,566 B2
(45) Date of Patent: May 19, 2020

(54) PIEZOELECTRIC DRIVEN SWITCHES INTEGRATED IN ORGANIC, FLEXIBLE DISPLAYS

(71) Applicant: Intel Corporation, Santa Clara, CA (US)

(72) Inventors: Shawna M. Liff, Scottsdale, AZ (US); Feras Eid, Chandler, AZ (US); Aleksandar Aleksov, Chandler, AZ (US); Sasha N. Oster, Marion, IA (US); Baris Bicen, Chandler, AZ (US); Thomas L. Sounart, Chandler, AZ (US); Johanna M. Swan, Scottsdale, AZ (US); Adel A. Elsherbini, Chandler, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 127 days.

(21) Appl. No.: 16/072,166

(22) PCT Filed: Apr. 1, 2016

(86) PCT No.: PCT/US2016/025666
§ 371 (c)(1),
(2) Date: Jul. 23, 2018

(87) PCT Pub. No.: WO2017/171861
PCT Pub. Date: Oct. 5, 2017

(65) Prior Publication Data
US 2019/0036002 A1    Jan. 31, 2019

(51) Int. Cl.
*G02B 26/00* (2006.01)
*H01L 41/09* (2006.01)
(Continued)

(52) U.S. Cl.
CPC .......... *H01L 41/0906* (2013.01); *F21S 10/02* (2013.01); *G02F 1/0128* (2013.01);
(Continued)

(58) Field of Classification Search
CPC . G02F 1/0128; G02F 1/0131; G02B 26/0858; G02B 26/00
See application file for complete search history.

(56) References Cited

U.S. PATENT DOCUMENTS 6,291,929 B1    9/2001  Heinz et al.
2002/0048422 A1    4/2002  Cotteverte et al.
(Continued)

OTHER PUBLICATIONS

International Search Report and Written Opinion for International Patent Application No. PCT/US2016/025666 dated Dec. 26, 2016, 10 pgs.
(Continued)

*Primary Examiner* — Joseph P Martinez
(74) *Attorney, Agent, or Firm* — Schwabe, Williamson & Wyatt, P.C.

(57) ABSTRACT

Embodiments of the invention include piezoelectrically driven switches that are used for modifying a background color or light source color in display systems, and methods of forming such devices. In an embodiment, a piezoelectrically actuated switch for modulating a background color in a display may include a photonic crystal that has a plurality of blinds oriented substantially perpendicular to a surface of the display. In an embodiment, the blinds include a black surface and a white surface. The switch may also include an anchor spaced away from an edge of the photonic crystal and a piezoelectric actuator formed on the surface of the anchor and a surface of the photonic crystal. Some embodiments may include a photonic crystal that is a multi-layer polymeric structure or a polymer chain with a plurality of nanoparticles spaced at regular intervals on the polymer chain.

25 Claims, 9 Drawing Sheets

(51) Int. Cl.

| | |
|---|---|
| *H01L 27/32* | (2006.01) |
| *H05B 45/00* | (2020.01) |
| *F21S 10/02* | (2006.01) |
| *G02F 1/01* | (2006.01) |
| *H01L 41/22* | (2013.01) |
| *H01L 51/00* | (2006.01) |
| *G06F 3/041* | (2006.01) |

(52) U.S. Cl.
CPC .......... *H01L 27/3232* (2013.01); *H01L 41/22* (2013.01); *H01L 51/0097* (2013.01); *H05B 45/60* (2020.01); *G06F 3/041* (2013.01)

(56) References Cited

U.S. PATENT DOCUMENTS

| | | |
|---|---|---|
| 2006/0257067 A1 | 11/2006 | Bratkovski et al. |
| 2010/0045141 A1 | 2/2010 | Pulskamp et al. |
| 2014/0198373 A1* | 7/2014 | Ray .................... G02B 26/007 359/291 |

OTHER PUBLICATIONS

International Preliminary Report on Patentability for International Patent Application No. PCT/2016/025666, dated Oct. 11, 2018,—7 pages.

\* cited by examiner

PIEZOELECTRIC DRIVEN SWITCHES INTEGRATED IN ORGANIC, FLEXIBLE DISPLAYS

CROSS-REFERENCE TO RELATED APPLICATION

This patent application is a U.S. National Phase Application under 35 U.S.C. § 371 of International Application No. PCT/US2016/025666, filed Apr. 1, 2016, entitled "PIEZOELECTRIC DRIVEN SWITCHES INTEGRATED IN ORGANIC, FLEXIBLE DISPLAYS," which designates the United States of America, the entire disclosure of which is hereby incorporated by reference in its entirety and for all purposes.

FIELD OF THE INVENTION

Embodiments of the present invention relate generally to the manufacture of piezoelectrically driven switches integrated on organic substrates. In particular, embodiments of the present invention relate to piezoelectrically driven switches that are used in flexible displays to alter color observed and methods for manufacturing such devices.

BACKGROUND OF THE INVENTION

Commercially available flexible displays are generally limited to organic light emitting diodes (OLEDs) and electronic-ink (e-ink) emitter based technologies due to the maturity of the manufacturing process, power consumption, and resulting color quality. In order to produce different colors on displays such as these, each pixel of the display may be a combination of sub-pixels that provide red, green, and blue (RGB) light. It is to be appreciated that the individual RGB color cells are not visible to the naked eye, but instead, are viewed as a local area (e.g., about 900 µm$^2$ in size) of a particular color based on the combinatorial percentage of RGB emitted. In some displays, blacks are produced by a black substrate below the RGB light sources.

OLEDs in particular offer a very high color gamut, greater than 400 dots per inch (dpi) resolution and high definition (HD) video quality, but they are power inefficient when displaying white backgrounds or when active in bright sunlight environments. Typically, to produce a white background, each of the sub-pixel colors are turned on to form the white light. As such, a significant amount of power is used. E-ink technologies are more power efficient and enables 4096 colors and 16 colors of grayscale in bright sunlight environments. However, the resolution is limited to 75 dpi and responsivity of 15 frames per second.

In order to overcome the power consumption issues while still providing a responsive display technology, some attempts have been made to fabricate displays that include the use of micro-LEDs, chalcogenide and quantum dots. These attempts aim to reduce the power consumption of the light sources, while still obtaining a wide color gamut and fast responsivity. However, the problem with producing a white background remains since all sub-pixels still need to be active to produce the white color.

Furthermore, certain colored LEDs or OLEDs are more efficient than other colors or harder to manufacture. Since multiple colors are needed for each pixel (e.g., RGB), power inefficient LEDs may still need to be used. The requirement to use inefficient light sources may limit attempts to reduce power consumption in the display.

DETAILED DESCRIPTION OF THE INVENTION

Figure 1A:
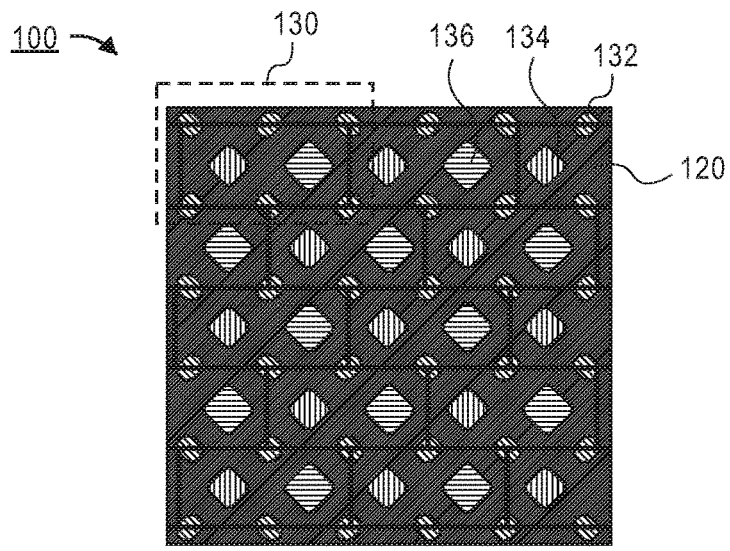
FIG. 1A is a zoomed in plan view illustration of a display to illustrate a plurality of pixels with a black background, according to an embodiment of the invention.

Described herein are systems that include piezoelectrically driven switches that are used in display technologies for altering background colors or the color of the light sources and methods of forming such devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention allow for improved power efficiency by providing a display with a modifiable background color. According to an embodiment, the background color may be switched between white, black, and transparent for more power efficiency on a pixel by pixel area or across the entire display. The different white, black, and transparent backgrounds may be obtained by using a photonic crystal that includes a plurality of blinds that are oriented perpendicular to the surface of the display. When oriented perpendicular to the surface of the display, the blinds may be sufficiently narrow so as not to be visible to the eye, thereby providing for a transparent background. In order to change the color of the background, a shear force may be applied to the photonic crystal to cause the orientation of the blinds to change with respect to the surface of the display. When the shear force is applied in a first direction, the white surface of the blinds may be exposed to provide a white background, and when the shear force is applied in a second direction, the black surface of the blinds may be exposed to provide a black background. Furthermore, mechanically stable switches may be used in order to hold the shear forces after they have been applied without requiring additional power.

Additional embodiments may utilize tensile or compressive pressure to alter the structure of a photonic crystal to change the color of a light source. For example, the compressive or tensile pressure applied to the photonic crystal may change the periodicity of the photonic crystal, the effective band-gap of the photonic crystal, and/or shift the plasmonic peak of the photonic crystal. As such, light emitted by the light source may be filtered to produce a desired color. Therefore, embodiments of the invention may utilize a single power efficient and/or easily manufacturable light source instead of needing to use potentially less efficient or harder to manufacture light sources in a multi-color (e.g., RGB) based display.

According to an embodiment, the forces applied to the photonic crystals may be supplied by a high performance piezoelectric material. High performance piezoelectric materials typically require a high temperature anneal (e.g., greater than 500° C.) in order to provide the proper crystal structure to attain the piezoelectric effect. As such, currently available devices that utilize high performance piezoelectric materials require a substrate that is capable of withstanding high temperatures (e.g., silicon or ceramics). However, embodiments of the invention use a laser annealing processes that limits the increase in temperature of the substrate on which the piezoelectric materials are formed, so that low temperature materials, such as organic materials, may be used for the photonic crystals and/or for the substrate of the display.

Referring now to FIG. 1A, a zoomed in portion of a display 100 is shown, according to an embodiment of the invention. The display 100 may include a plurality of pixels 130. In an embodiment, each pixel 130 may include one or more light sources. For example, each pixel 130 may include a green light source 132, a red light source 134, and a blue light source 136. Additionally, the pixels may be formed over a colored or transparent background. In FIG. 1A, the background is a black background 120.

Figure 1B:
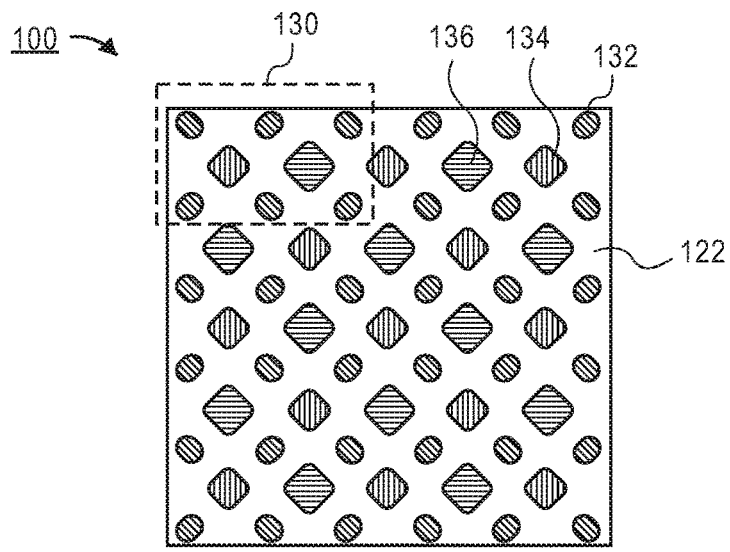
FIG. 1B is a zoomed in plan view illustration of a display to illustrate a plurality of pixels with a white background, according to an embodiment of the invention.
Figure 1C:
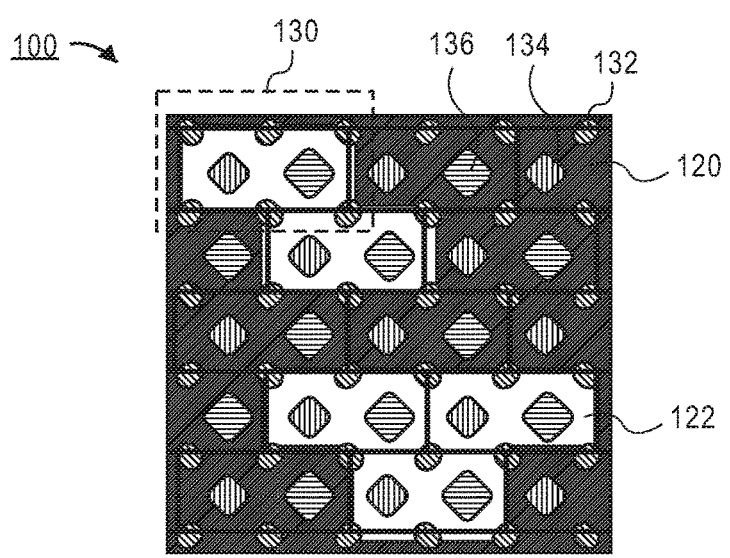
FIG. 1C is a zoomed in plan view illustration of a display to illustrate a plurality of pixels that include white and black backgrounds, according to an embodiment of the invention.

According to an embodiment, the background may be changed to different colors. For example, in FIG. 1B, the background has been changed to a white background 122. Changes to the background color may be implemented with a piezoelectric actuator that applies a shear force to a photonic crystal. A more detailed explanation of the photonic crystal and the piezoelectric actuators are provided below. As noted above, the production of white in the display typically requires a high amount of power since all of the light sources need to be activated. However, embodiments of the present invention may rely on a white background 122 to provide the color white without needing to activate the light sources. Furthermore, since the white background 122 may be switched back to black 120, the benefits of a black background 120 are still available to the display.

According to an embodiment, the background may also be controlled on a pixel-by-pixel basis in order to provide pixels with black backgrounds 120 and pixels with white backgrounds 122 at the same time. This is beneficial when both white and black colors are needed to form an image on the display (e.g., a text document may be primarily white with black regions for the text). Typically, the large area of white displayed on the screen would result in significant power consumption. However, embodiments of the present invention allow for the background to be shifted to white 122 in some regions of the display, thereby eliminating the need for activating all of the light sources in those regions.

Embodiments of the invention are able to produce a dynamic (i.e., modifiable) background color by using one-dimensional photonic crystals comprised of polymeric solid or gel that contains pigmented particles. Such an embodiment is illustrated in FIG. 2A.

Figure 2A:
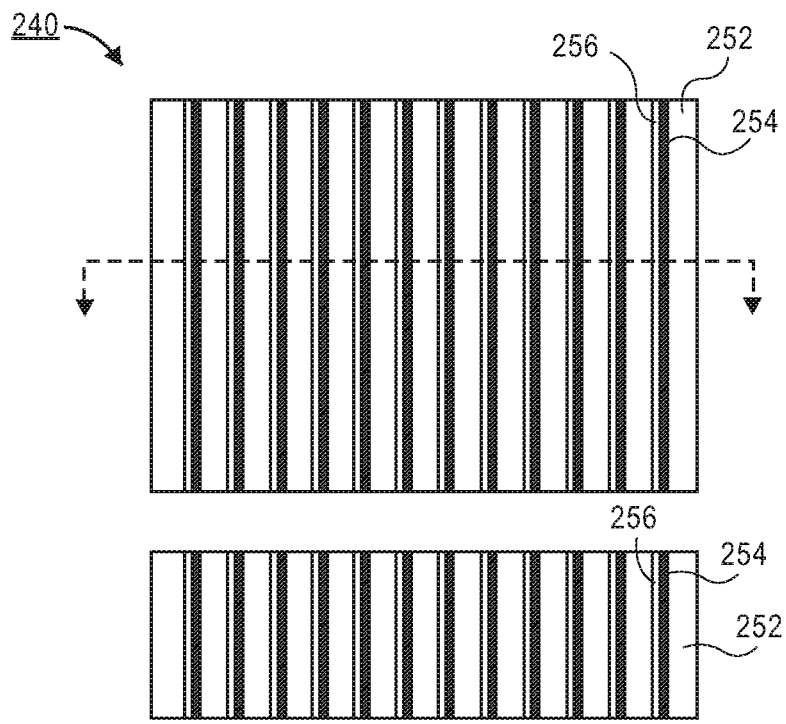
FIG. 2A is a plan view and a corresponding cross-sectional illustration of a photonic crystal with alternating columns of different colored blinds, according to an embodiment of the invention.

In FIG. 2A a plan view illustration a photonic crystal 240 and a cross-sectional illustration along the dashed line in the plan view are shown, according to an embodiment of the invention. As illustrated, the pigmented particles in the photonic crystal 240 may be long pigmented layers (254, 256) that run through the thickness of the film 252. According to an embodiment, the pigmented particles may be black particles 254 and white particles 256 in order to produce a white or black background. In an embodiment, the black particles 254 and the white particles 256 may be formed in contact with each other to form columns with a white side 256 and a black side 254. As used herein, the columns may be referred to as blinds. Additional embodiments may include blinds that are a single color. For example, both surfaces of the blinds may be black or both surfaces of the blinds may be white.

According to an embodiment, the white portion of the blinds 256 may be formed with any white, light scattering or reflective material layer, such as titanium dioxide, and the black portion of the blinds 254 may be any black material, such as a carbon black filled polymer or montmorillonite (i.e., clay sheets). In an embodiment, the materials may be formed into the blinds with an extrusion process that includes a host polymer 252 or by layer-by-layer deposition to provide sheets that have a regular spacing between layers. While the blinds 254, 256 are visible in the plan view in FIG. 2A, it is to be appreciated that the blinds 254, 256 may have a thickness small enough that they are not visible to the eye (e.g., the combined thickness of the black portion of the blinds 254 and the white portion of the blinds 256 may be less than approximately 1 μm thick). Accordingly, when the photonic crystal 240 is not actuated, only the host polymer 252 is visible to the eye. In some embodiments, the host polymer 252 may be transparent. While the thickness of the blinds 254, 256 may be limited by the resolution capacity of a human eye, the length of the blinds 254, 256 may be any desired length, and may be as much as millimeters long. After the extrusion process, the photonic crystal 240 may be laminated across the display during standard buildup processes. Alternatively, the photonic crystal may be grown via bottoms-up or tops-down processing (e.g., lithography, sputter, etch etc.).

Figure 2B:
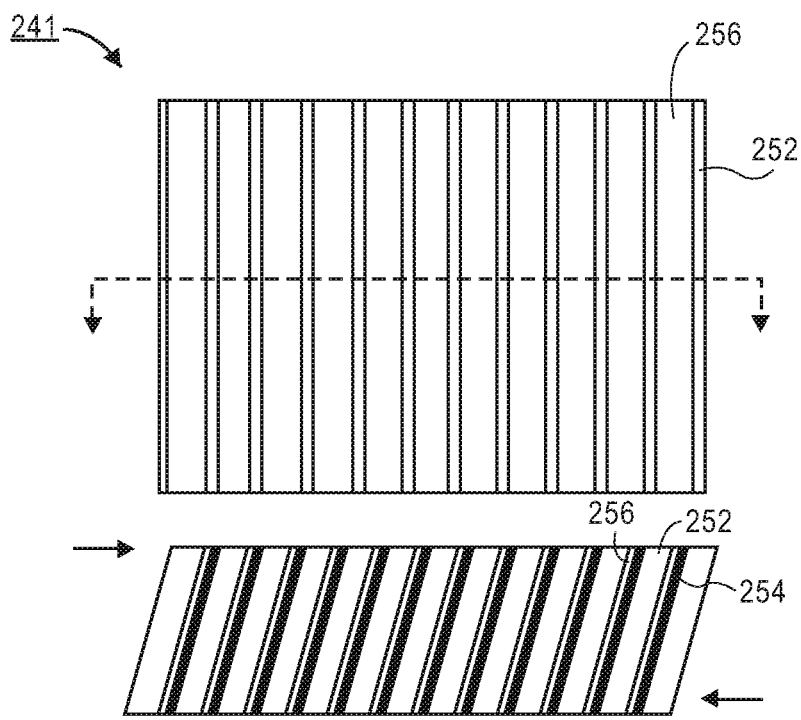
FIG. 2B is a plan view and corresponding cross-sectional illustration of a photonic crystal with alternating columns of different colored blinds that is being stressed with a shear force to expose a first side of the colored blinds, according to an embodiment of the invention.
Figure 2C:
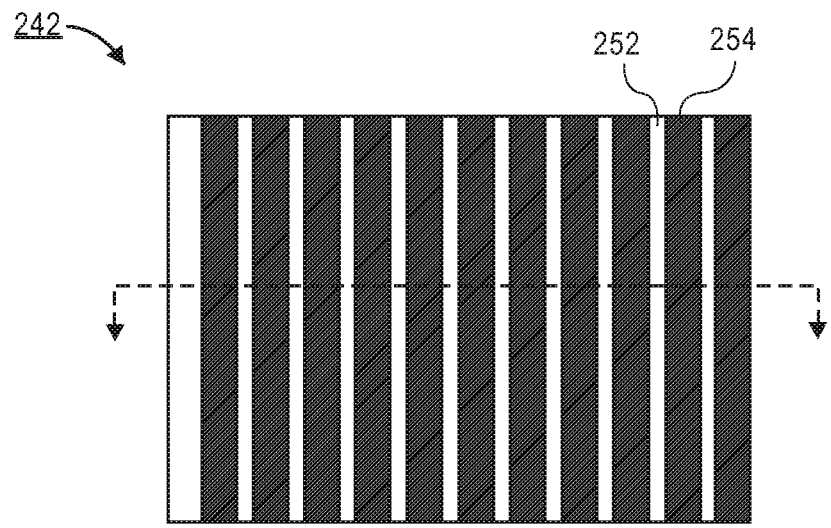
FIG. 2C is a plan view and corresponding cross-sectional illustration of a photonic crystal with alternating columns of different colored blinds that is being stressed with a shear force to expose a second side of the colored blinds, according to an embodiment of the invention
Figure 2C:
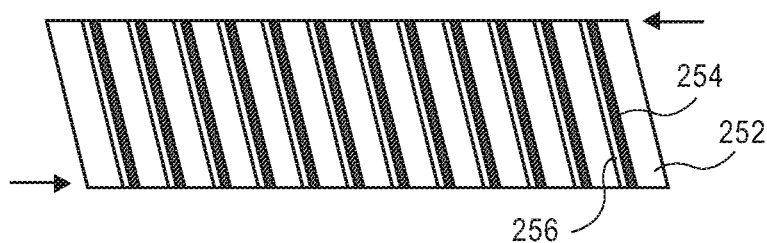

Referring now to FIGS. 2B and 2C, plan views and corresponding cross-sectional illustrations of the photonic crystal under different actuation states are shown, according to embodiments of the invention. In FIG. 2B the photonic crystal 241 is actuated so that the white portion of the blinds 256 are exposed. For example, the photonic crystal may be actuated by applying a shear force to the photonic crystal, as indicated by the arrows. According to an embodiment, the shear force may be applied by a piezoelectric actuator that will be described in greater detail below. The shear force causes the blinds 254, 256 to tilt so that they are no longer substantially perpendicular with the plane of the display. In FIG. 2B, the shear force is applied so that the blinds 254, 256 are tilted so that the white portion 256 is exposed to the surface.

In FIG. 2C the photonic crystal 242 is actuated so that the black portion of the blinds 254 are exposed. As illustrated by the arrows, the shear force applied to the photonic crystal 242 to cause the black portion of the blinds 254 to be exposed is opposite in direction of shear force applied in FIG. 2B. According to an embodiment, the shear force causes the blinds 254, 256 to tilt so that they are no longer substantially perpendicular with the plane of the display, thereby allowing the black, light absorbing portion 254 to be exposed.

According to an embodiment, the thickness of the photonic crystal 240, the combined width of the black portion and the white portion of each blind 254, 256 and the spacing between each blind 254, 256 may determine the amount of shear deformation in the photonic crystal required to produce a black or white background. For example, in a photonic crystal 240 with a thickness of 10 μm and blinds 254, 256 that have a width of 0.1 μm and a spacing of 1 μm, a shear strain of 10% may be needed to actuate between a neutral state and the black or white states. By increasing the thickness of the photonic crystal 240 and decreasing the spacing between blinds 254, 256 the shear deformation required may be minimized.

While the shear forces are illustrated in the positive and negative directions in order to expose a white surface and a black surface in FIGS. 2B and 2C, it is to be appreciated that the shear force may be limited to a single direction when only one colored surface is needed. For example, if only a black surface is needed, then the photonic crystal may be configured so that shear force is only applied in one direction.

Figure 3A:
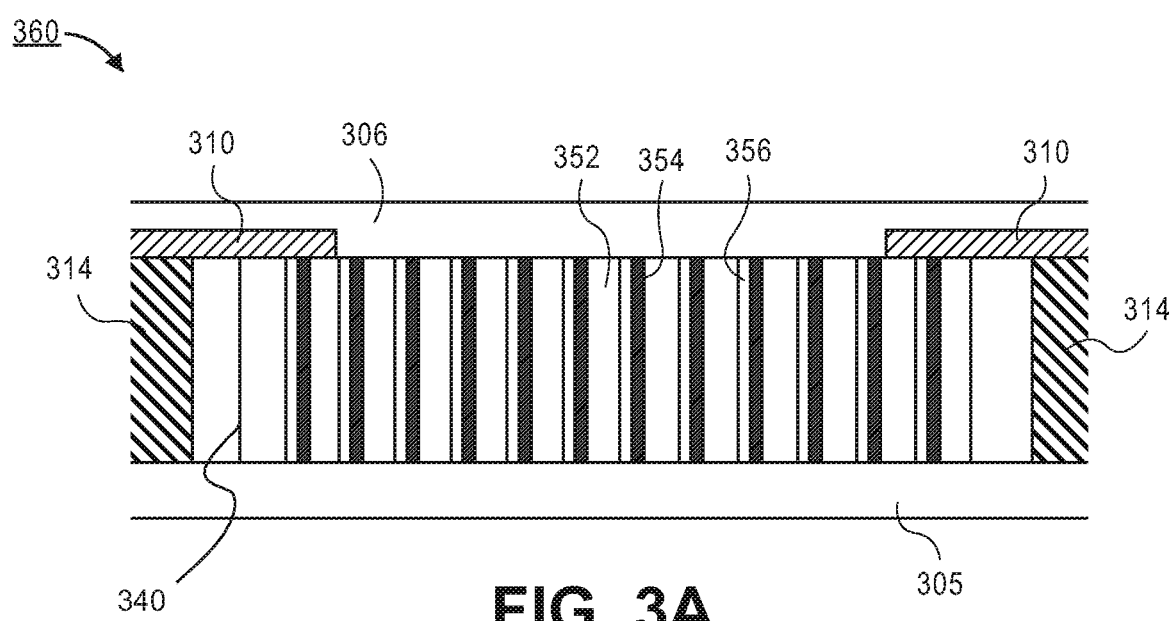
FIG. 3A is a cross-sectional illustration of a layer in a display that includes a photonic crystal with alternating columns of different colored blinds that are actuated with a piezoelectric material, according to an embodiment of the invention.
Figure 3B:
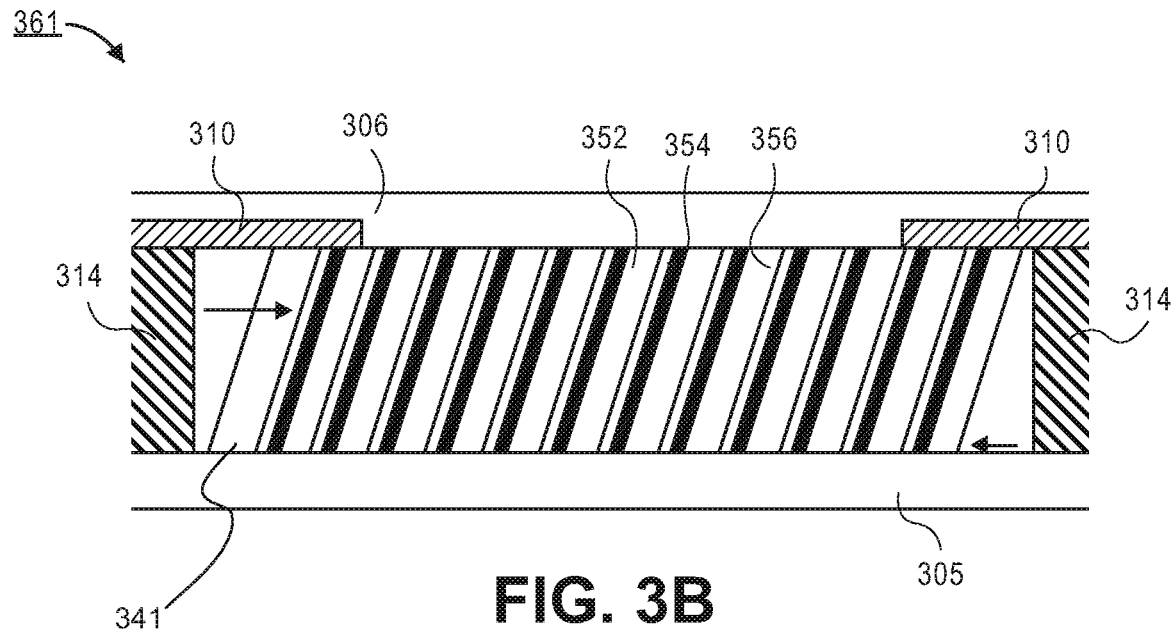
FIG. 3B is a cross-sectional illustration of a layer in a display that includes a photonic crystal with alternating columns of different colored blinds that has been actuated with a piezoelectric material to expose a first side of the colored blinds, according to an embodiment of the invention.
Figure 3C:
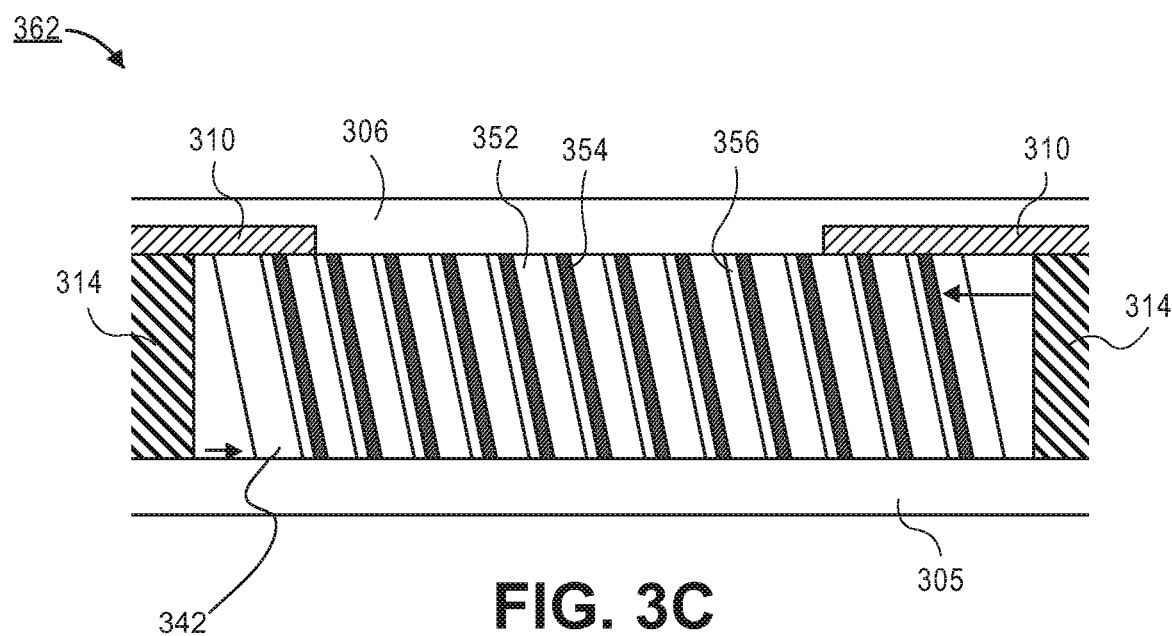
FIG. 3C is a cross-sectional illustration of a layer in a display that includes a photonic crystal with alternating columns of different colored blinds that has been actuated with a piezoelectric material to expose a second side of the colored blinds, according to an embodiment of the invention.

Referring now to FIG. 3A-3C, cross-sectional illustrations of a photonic crystal with blinds that are attached to an actuator in a layer of a display are shown, according to embodiments of the invention. Referring now to FIG. 3A, the photonic crystal 340 may be formed over a substrate 305. For example, the substrate may be any prior display layer. In an embodiment, the photonic crystal 340 may be formed in a layer below or above the light sources, or the photonic crystal 340 may be formed in the same layer as the light sources. Forming the photonic crystal in a plane or layer outside the light source may allow for independence in processing and performance of each layer.

According to an embodiment, a piezoelectric actuator 310 may be formed over a top surface of the photonic crystal 340. In the illustrated embodiment, a piezoelectric actuator 310 is formed on opposite edges of the photonic crystal 340. According to an embodiment, the piezoelectric actuators 310 may include one or more piezoelectric layers formed between electrodes (not shown). Piezoelectric material typically requires a high temperature anneal (e.g., greater than 500° C.) in order to provide the proper crystal structure to provide the piezoelectric effect. As such, high performance piezoelectric materials generally require a substrate that is capable of withstanding high temperatures (e.g., silicon, glass, or ceramic). Organic substrates typically cannot withstand temperatures above 260° C. However, embodiments of the present invention allow for a piezoelectric layer to be formed at much lower temperatures. For example, instead of a high temperature anneal, embodiments include depositing the piezoelectric material in an amorphous phase and then using a pulsed laser to crystalize the piezoelectric layer. In an embodiment, the pulsed laser annealing process may include the use of an excimer laser with an energy density in the range of 10-100 mJ/cm$^2$ and a pulse width in the range 10-50 ns. Additionally, the piezoelectric layer may be deposited with a sputtering process, an ink jetting process, or the like. According to an embodiment, the piezoelectric layer may be lead zirconate titanate (PZT), potassium sodium niobate (KNN), zinc oxide (ZnO), or combinations thereof. Accordingly, embodiments of the invention allow for piezo-electrically actuated photonic crystals to be formed. Additionally, embodiments allow for the display substrate to be a low-temperature material as well. As such, flexible or bendable materials that are typically low temperature organic substrates may be utilized, according to an embodiment of the invention.

Forming two piezoelectric actuators 310 allows for an increased amount of shear force that is applied to the photonic crystal 340. For example, a first piezoelectric actuator 310 may be contracted while a second piezoelectric actuator is expanded. According to an embodiment, the piezoelectric actuators 310 may be mounted to an anchor 314. The anchors 314 may provide a substantially immovable support that allows for the force from the piezoelectric actuators 310 to be transferred to the photonic crystal 340. Additionally, the anchors 314 may provide any needed electrical circuitry needed for actuating the piezoelectric actuators 310. In order to allow room for the photonic crystal 340 to move to an actuated state, an air gap may be formed between the anchors 314 and the photonic crystal 340. In an embodiment, additional display layers 306 may be formed over the photonic crystal 340 and the piezoelectric actuators 310. For example, the additional display layers may be light source layers, passivation lays, or the like.

Referring now to FIG. 3B, a cross-sectional illustration of a photonic crystal 341 that has been actuated so that the white portion 356 of the blinds are exposed is shown, according to an embodiment of the invention. As illustrated, the photonic crystal 341 is actuated by expanding and contracting opposing piezoelectric actuators 310. The deformation of the photonic crystal 341 may be controlled by providing a voltage to the piezoelectric actuators 310. The piezoelectric material in the piezoelectric actuators respond by being strained in an amount proportional to the voltage applied. As such varying the voltage allows for the amount of deflection to be accurately controlled. Accordingly, the deformation of the photonic crystal 341 is not limited to a digital response. For example, analog control may be used to partially turn the background white when the photonic crystal 341 is not fully actuated, thereby providing additional shades for the background color.

Referring now to FIG. 3C, a cross-sectional illustration of a photonic crystal 342 that has been actuated so that the black portion 354 of the blinds are exposed is shown, according to an embodiment of the invention. As illustrated, the photonic crystal 342 is actuated by expanding and contracting opposing piezoelectric actuators 310 in the opposite direction that was used to obtain the white background 356. Since the deformation of the photonic crystal 342 is not limited to a digital response, analog control may allow for a partially black background to be formed when the photonic crystal 342 is not fully actuated, thereby providing shades of gray for the background color.

According to an embodiment, the deformation of the photonic crystals described in FIGS. 3B and 3C may be held by continuing to apply the voltage to the piezoelectric actuators 310. However, continually maintaining the voltage may significantly increase power consumption. As such, embodiments of the invention may also include a bi- or tri-stable mechanical switch for maintaining an actuated state after the voltage is removed from the piezoelectric actuators. Examples, of suitable switches are described in greater detail below.

In addition to controlling the background color with piezoelectrically actuated photonic crystals that are deformed with shear force, embodiments of the invention may also utilize photonic crystals that are deformed with a compressive or tensile force for color modulation of the light source. As described above, color modulation may allow for a single light source to be used in order to produce all needed colors. Additionally, the color modulation may be used to perform color correction when a bendable display is flexed.

Figure 4A:
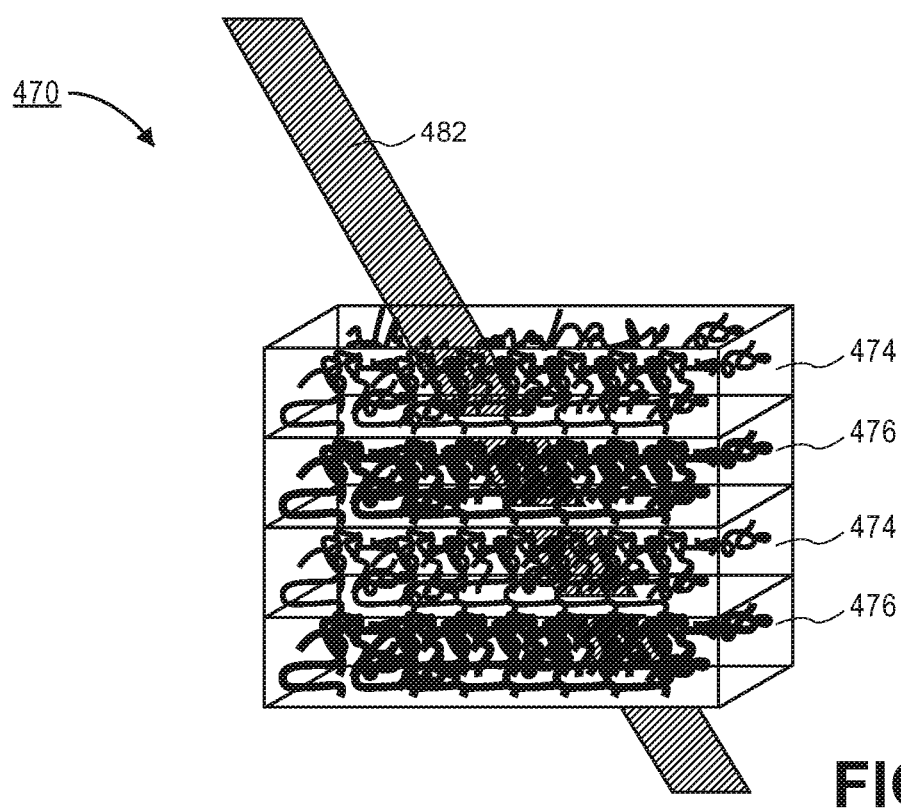
FIG. 4A is a perspective illustration of a multi-layer photonic crystal that includes a compliant layer and a rigid layer, according to an embodiment of the invention.

Referring now to FIG. 4A, a perspective view of a photonic crystal 470 that includes a polymeric multi-layered structure is shown, according to an embodiment of the invention. According to an embodiment, the multi-layered photonic crystal 470 may include alternating layers of a compliant material 476 and a rigid material 474. In the illustrated embodiment, two layers of the compliant material 476 are shown in an alternating pattern with two layers of the rigid material 474. However, embodiments are not limited to such configurations. For example, there may be any number of alternating layers, and/or more than two material types may be formed in the photonic crystal 470.

Figure 4B:
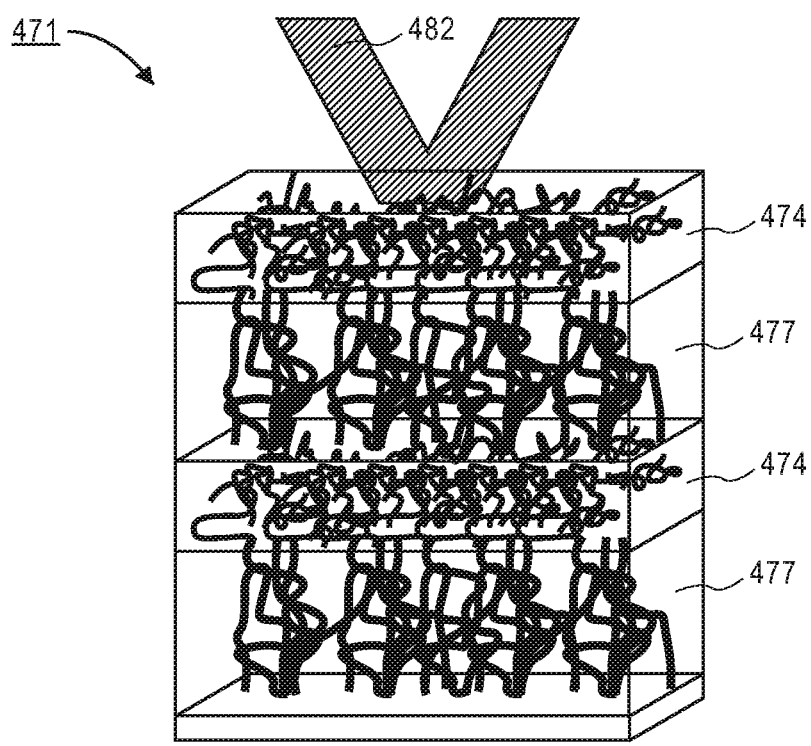
FIG. 4B is a perspective illustration of the multi-layer photonic crystal in FIG. 4A with the compliant layer expanded, according to an embodiment of the invention.

In an embodiment, where layer 476 is more compliant than layer 474, tensile or compressive strain applied to the photonic crystal 470 may result in a change in the dimensions (e.g., thickness) of the compliant layer 476 by causing the polymer chains to be elongated or compressed. FIG. 4B illustrates a photonic crystal 471 in which the compliant layers 476 have been expanded to form expanded compliant layers 477. The expansion of the layers results in a change to the periodic structure and effective bandgap of the photonic crystal 471. These changes may be used to filter light 482 to provide a desired light output. Alternatively, the compliant layers 476 may be compressed. Compressing the compliant layers may also change the periodic structure and effective bandgap of the photonic crystal 471.

Figure 5A:
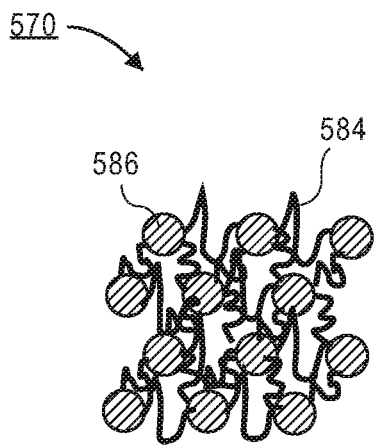
FIG. 5A is a schematic illustration of a photonic crystal that includes a plurality of nanoparticles attached on polymer chains, according to an embodiment of the invention.
Figure 5B:
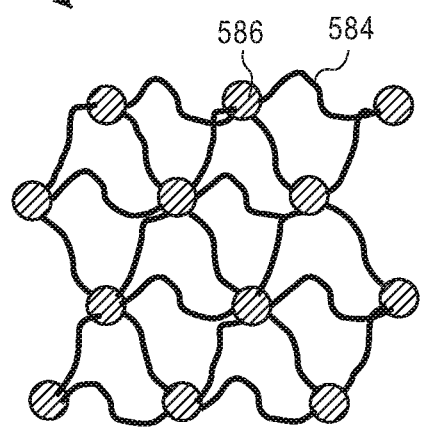
FIG. 5B is a schematic illustration of the photonic crystal in claim 5A after the polymer chains are expanded to increase the spacing between the nanoparticles, according to an embodiment of the invention.

According to an additional embodiment of the invention, a photonic crystal may include a plurality of nanoparticles attached at a regular spacing in a polymeric chain. As the photonic crystal is expanded or compressed, the spacing of the nanoparticles changes as well. The change in the nanoparticle spacing may result in a shifting of the plasmonic coupling peaks and the observed color. A photonic crystal according to such an embodiment is illustrated in FIGS. 5A and 5B. Referring now to FIG. 5A, a photonic crystal 570 is shown that includes an entropy-coiled polymer chain 584 with a plurality of nanoparticles 586 spaced at regular intervals on the polymer chain 584. For example, the nanoparticles 586 may be gold nanoparticles or any other suitable material. In FIG. 5B, a photonic crystal 571 is expanded. The expansion of the photonic crystal results in the polymer chain 584 being stretched. Accordingly, the spacing between the nanoparticles 586 increases, altering the periodicity and the light color response, as described above.

Figure 6A:
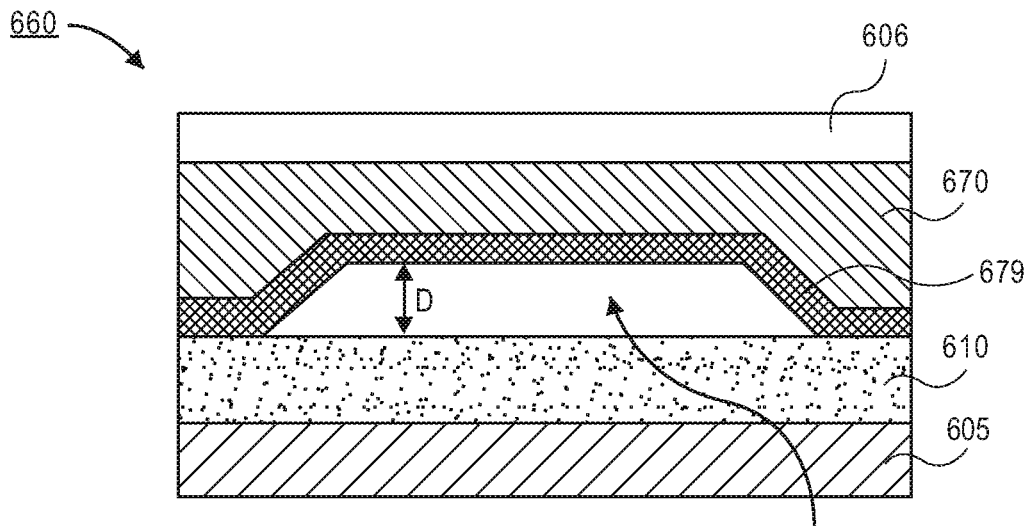
FIG. 6A is a cross-sectional illustration of a layer in a display that includes a photonic crystal that is formed over a piezoelectrically actuated cymbal, according to an embodiment of the invention.
Figure 6B:
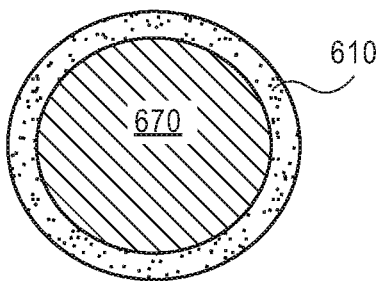
FIG. 6B is a plan view of the layer in FIG. 6A that illustrates a portion of the photonic crystal above the piezoelectrically actuated cymbal, according to an embodiment of the invention.

Referring now to FIGS. 6A and 6B, a cross-sectional illustration and a partial plan view of a photonic crystal 670 that is piezoelectrically actuatable are shown, according to an embodiment of the invention. According to an embodiment, the photonic crystal 670 may be a photonic crystal similar to the ones described above with respect to FIGS. 4A-4B and 5A-5B. For example, the photonic crystal 670 may be a multi-layer photonic crystal or a polymer with regularly spaced nanoparticles within the macromolecular chains.

In FIG. 6A, a piezoelectric layer 610 is formed over a previous substrate layer 605. For example, the substrate 605 may be any prior display layer. According to an embodiment, a cymbal 679 may be formed between the piezoelectric layer 610 and a photonic crystal 670. The cymbal 679 may allow for the pressure applied to the photonic crystal to be amplified. For example, the top surface of the cymbal 679 has a smaller surface area than the piezoelectric material. As such, the same amount of force is applied over a smaller area, which results in higher pressures. Accordingly, the range of expansion and contraction of the photonic crystal is increased, thereby allowing for a greater range of color variation.

In the illustrated embodiment, a portion of the cymbal 679 may be spaced away from piezoelectric layer 610 by a cavity 673. In an embodiment, the cavity 673 may separate the components by a distance D. The cavity 673 may be filled with air or the cavity 673 may be filled with a liquid or compliant solid (e.g., a gel). In one embodiment, the gap 673 may be formed by depositing the cymbal 673 over a sacrificial layer (not shown) that may be removed after the cymbal is formed (e.g., by thermal degradation). Alternatively, the sacrificial layer may be a substantially solid material at temperatures below the operation temperature of the display. As such, the cymbal 673 may be formed in a low-temperature process to allow for a rigid structure to serve as scaffolding for the formation of the cymbal 673. After the cymbal 673 is formed, the temperature may be raised to allow for the sacrificial material to melt. In such an embodiment, the sacrificial material may remain as a liquid in the final structure. In yet another embodiment, the cymbal 673 may be formed on a different substrate than the piezoelectric layer 610 and then laminated over the piezoelectric layer 610.

Figure 7A:
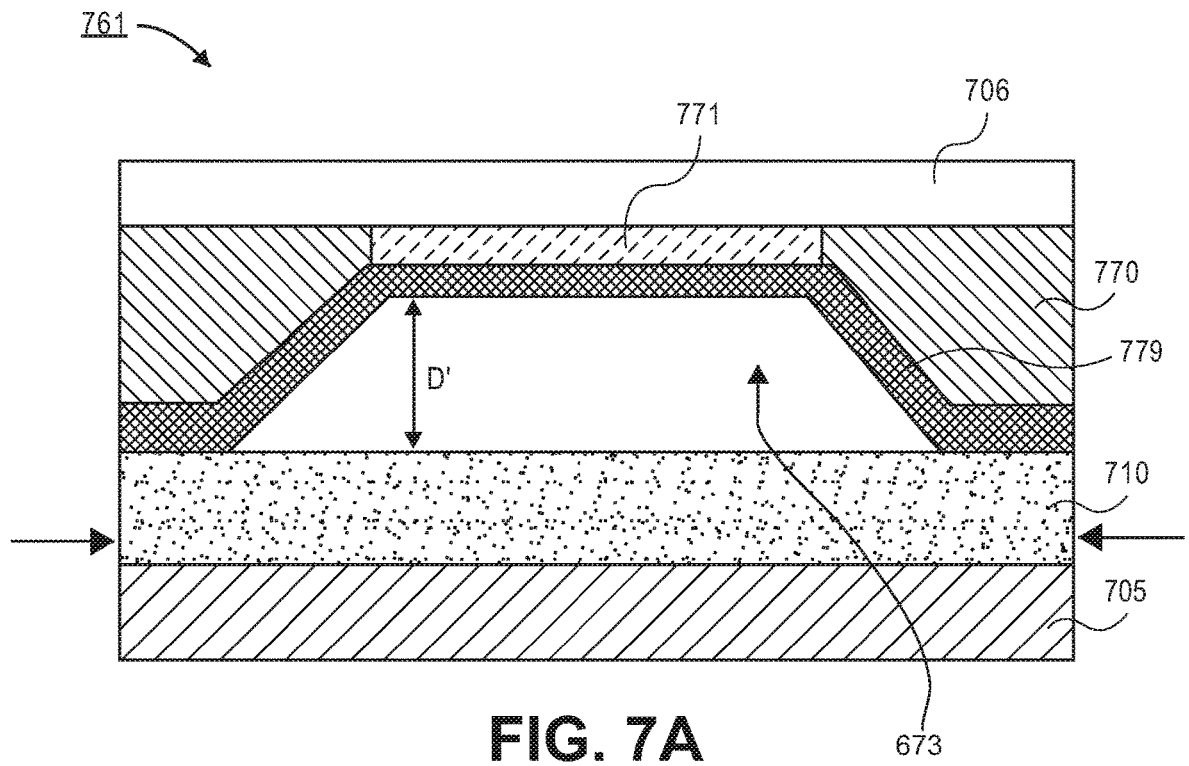
FIG. 7A is a cross-sectional illustration of the layer in FIG. 6A after the cymbal is actuated, according to an embodiment of the invention.
Figure 7B:
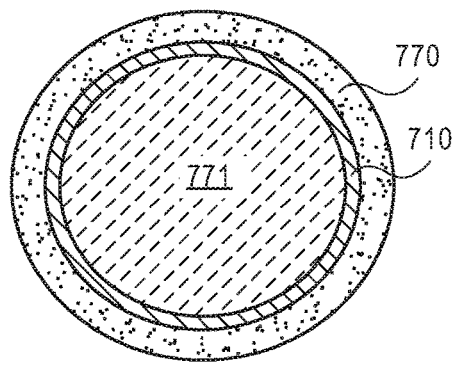
FIG. 7B is a plan view of the layer in FIG. 7A that illustrates a portion of the photonic crystal above the piezoelectrically actuated cymbal, according to an embodiment of the invention.

Referring now to FIGS. 7A and 7B, the piezoelectric layer 710 is actuated in order to induce compressive or tensile deformation in the photonic crystal 770. In embodiments where a cymbal is used, a portion of the photonic crystal 770 may remain in a non-deformed state, and a portion of the photonic crystal 771 formed between the top surface of the cymbal 779 and a subsequent layer 706 of the display may be compressed. In order to cause the top surface of the cymbal 779 to extend away from the piezoelectric layer 710, the piezoelectric layer may be contracted in the X-direction, as indicated by the arrows. As a result, the distance D' may be greater than the distance D in the unactuated state illustrated in FIG. 6A. Alternatively, the top surface of the cymbal 779 may be deflected towards the piezoelectric layer 710 by causing the piezoelectric layer 710 to expand in the X-direction (not shown). Reducing the distance D' relative to the distance D provides a tensile strain on the photonic crystal 770.

The deformation of the photonic crystal 771 may be controlled by providing a voltage to the piezoelectric layer 710. The piezoelectric layer 710 responds to the voltage by being strained in an amount proportional to the voltage applied. As such, varying the voltage allows for the amount of deflection to be accurately controlled. Accordingly, the deformation of the photonic crystal 771 is not limited to a digital response. For example, analog control may be used to provide any desired amount of force on the photonic crystal, thereby providing a large color gamut, even when a single light source is used.

In addition to modulating the color of a light source to provide the desired color for a pixel, embodiments may also use the color correcting piezoelectric actuators to compensate for strain induced in the photonic crystals from the bending or flexing of the substrate. For example, when the substrate is strained by flexing or bending, the photonic crystals may also be strained, resulting in an unwanted shift in the color. In order to compensate for this unwanted shift, one or more strain gauges may be included in the flexible substrate to monitor the deformation of the substrate. In an embodiment, the stain gauges may be piezoelectric strain gauges. The output voltage from strain gauge may then be used to determine how much the photonic crystals need to be compressed or strained to compensate for the deformation resulting from the flexing or bending of the substrate.

The above examples describe systems where the deformation takes place upon energizing the piezoelectric layers. As noted above, the extent of deformation may be proportional to the voltage applied (analog) or treated in a binary manner (digital on or off). However, it is to be appreciated that some embodiments of the invention may further include a bi- or tri-stable arrangement such that, upon charge, the movement is shifted and held and conversely, charged again to move back to the original position. Additionally, in some embodiments, the process may be driven in reverse to move to deform a photonic crystal in the opposite direction. Accordingly, the actuated states may be maintained even when the power is removed, thereby reducing the overall system power.

Figure 8A:
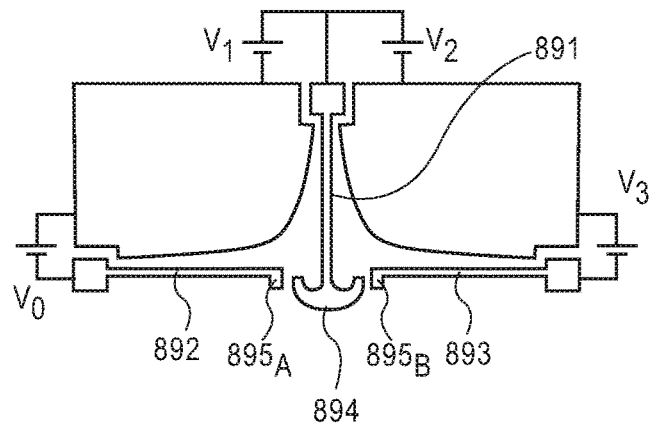
FIG. 8A is a schematic illustration of a mechanically tri-stable switch that is in a first position, according to an embodiment of the invention.
Figure 8B:
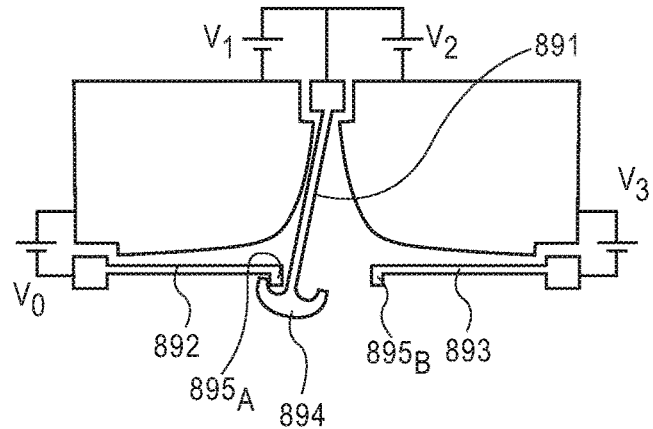
FIG. 8B is a schematic illustration of a mechanically tri-stable switch that is in a second position, according to an embodiment of the invention.
Figure 8C:
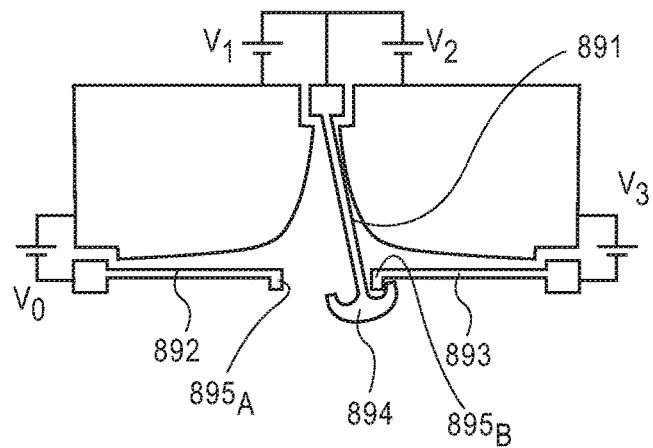
FIG. 8C is a schematic illustration of a mechanically tri-stable switch that is in a third position, according to an embodiment of the invention.

An example of one suitable tri-stable mechanical state switch that may be used according to embodiments of the invention is described with respect to FIGS. 8A-8C. While one example is shown, it is to be appreciated that embodiments of the invention may use any bi- or tri-stable mechanical state switch. As illustrated, the switch may be open (FIG. 8A), in a second position (FIG. 8B), or in a third position (FIG. 8C). According to an embodiment, the switch 891 is mechanically held in the second and third positions by a mechanical anchor 894. For example in FIG. 8B, the anchor 894 of the switch 891 is locked on to an end piece $895_A$ of beam 892. Similarly, in FIG. 8C, the anchor 894 of the switch 891 is locked on to an end piece $895_B$ of beam 893.

In order to cause the anchor 894 to lock into either position (or be removed from the locked position) the switch 891 and the beam (892 or 893 depending on the position to which the switch 891 is being actuated) are actuated sequentially to bring the anchor 894 and the end piece 895 into contact. For example, beam 892 may be actuated so that the beam 892 is deflected upwards. Thereafter, the switch 891 may be actuated so that the anchor 894 is deflected under the end piece $895_A$ of beam 892. Once in position, the voltage applied to beam 892 may be removed, to allow beam 892 to return to a neutral position. However, the anchor 894 catches and secures the end piece $895_A$, preventing the full return back to the neutral position. After the end piece $895_A$ and the anchor 894 are secured to each other, the voltage to the switch 891 may be released since the switch 891 is prevented from returning back to the neutral position.

In order to release switch 891 and allow it to return to the neutral position, the beam 892 may be deflected upwards by applying a voltage, thereby disengaging the end piece $895_A$ from the anchor 894. Since the voltage has been removed from the switch 891, the switch 891 may return to the neutral position and the voltage to beam 892 may also be released allowing beam 892 to return to the neutral position as well. A similar sequence may be used to cause the switch 891 to be secured to beam 893.

Figure 9:
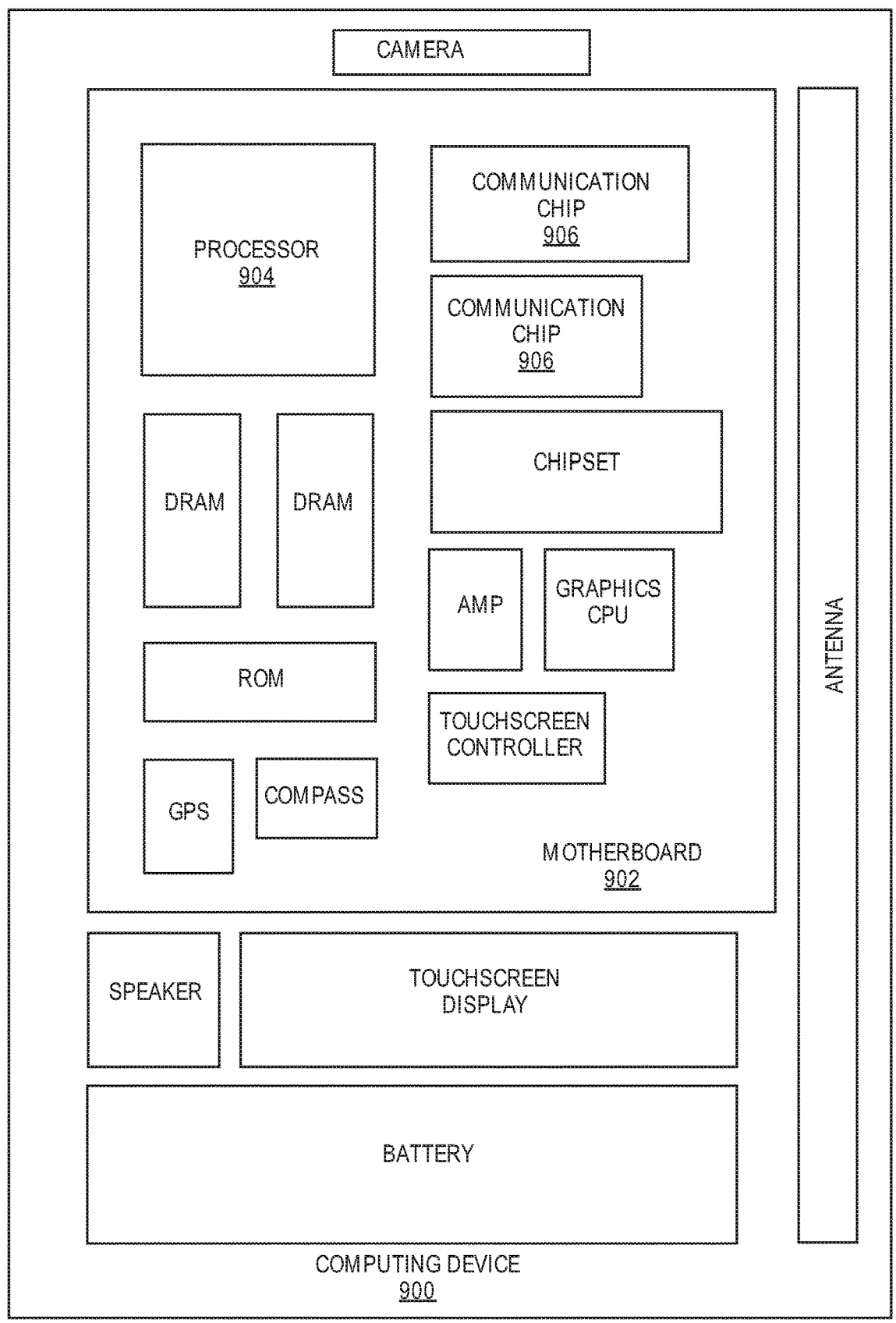
FIG. 9 is a schematic of a computing device built in accordance with an embodiment of the invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be packaged on a display and provide a voltage to one or more piezoelectric actuators for deforming photonic crystals, in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be packaged on a display and provide a voltage to one or more piezoelectric actuators for deforming photonic crystals, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a piezoelectrically actuated switch for modulating a background color in a display, comprising: a photonic crystal that has a plurality of blinds oriented substantially perpendicular to a surface of the display, wherein the blinds include a first surface and a second surface; an anchor spaced away from an edge of the photonic crystal; and a piezoelectric actuator formed on the surface of the anchor and a surface of the photonic crystal.

Additional embodiments of the invention include a piezoelectrically actuated switch, wherein the blinds are spaced apart from each other by a transparent film.

Additional embodiments of the invention include a piezoelectrically actuated switch, wherein the blinds have a thickness less than approximately 1 μm.

Additional embodiments of the invention include a piezoelectrically actuated switch, wherein the blinds have a thickness of approximately 0.1 μm.

Additional embodiments of the invention include a piezoelectrically actuated switch, wherein the first surfaces of the blinds are black surfaces, and wherein the second surfaces of the blinds are white or reflective surfaces.

Additional embodiments of the invention include a piezoelectrically actuated switch, wherein the black surfaces are a carbon black filled polymer, and wherein the white surfaces are titanium dioxide.

Additional embodiments of the invention include a piezoelectrically actuated switch, wherein the first surfaces and the second surfaces are the same color.

Additional embodiments of the invention include a piezoelectrically actuated switch, further comprising a plurality of photonic crystals each formed adjacent to a pixel of the display.

Additional embodiments of the invention include a piezoelectrically actuated switch, wherein each photonic crystal is independently controllable.

Additional embodiments of the invention include a piezoelectrically actuated switch, further comprising: a bi- or tri-stable mechanical switch.

Embodiments include a piezoelectrically actuated switch for modulating a color of a light source in a display, comprising: a piezoelectric layer formed over a substrate; a cymbal formed over the piezoelectric layer, wherein a portion of the cymbal is spaced away from a surface of the piezoelectric layer forming a cavity between the cymbal and the piezoelectric layer; and a photonic crystal formed over a top surface of the cymbal.

Additional embodiments of the invention include a piezoelectrically actuated switch, wherein the photonic crystal is a multi-layer polymeric structure.

Additional embodiments of the invention include a piezoelectrically actuated switch, wherein the multi-layer polymeric structure includes alternating layers of a compliant material and a rigid material.

Additional embodiments of the invention include a piezoelectrically actuated switch, wherein increasing the thickness of the compliant material changes to the periodic structure and effective bandgap of the photonic crystal.

Additional embodiments of the invention include a piezoelectrically actuated switch, wherein the photonic crystal is an entropy-coiled polymer chain with a plurality of nanoparticles spaced at regular intervals among the polymer network.

Additional embodiments of the invention include a piezoelectrically actuated switch, wherein the nanoparticles are gold nanoparticles.

Additional embodiments of the invention include a piezoelectrically actuated switch, wherein increasing the spacing of the nanoparticles shifts the plasmonic coupling peaks of the photonic crystal.

Additional embodiments of the invention include a piezoelectrically actuated switch, wherein air is formed in the gap between the cymbal and the piezoelectric layer.

Additional embodiments of the invention include a piezoelectrically actuated switch, wherein a liquid or soft deformable solid, or semi-solid is formed in the gap between the cymbal and the piezoelectric layer.

Additional embodiments of the invention include a piezoelectrically actuated switch, further comprising: a bi- or tri-stable mechanical switch.

Embodiments of the invention include a display device, comprising: a plurality of light sources formed on a substrate; a plurality of first piezoelectrically actuated switches, wherein the plurality of first piezoelectrically actuated switches each comprise: a photonic crystal that has a plurality of blinds oriented substantially perpendicular to a surface of the display, wherein the blinds include a black surface and a white surface; an anchor spaced away from an edge of the photonic crystal; and a piezoelectric actuator formed on the surface of the anchor and a surface of the photonic crystal; and a plurality of second piezoelectrically actuated switches, wherein the plurality of second piezoelectrically actuated switches each comprise: a piezoelectric layer; a cymbal formed over the piezoelectric layer, wherein a portion of the cymbal is spaced away from a surface of the piezoelectric layer forming a cavity between the cymbal and the piezoelectric layer; and a photonic crystal formed over a top surface of the cymbal.

Additional embodiments include a display, wherein the photonic crystal in each of the plurality of second piezoelectrically actuated switches is a multi-layer polymeric structure or a plasticized polymer chain with a plurality of nanoparticles spaced at regular intervals on the polymer chain.

Additional embodiments include a display, wherein each photonic crystal in the plurality of first piezoelectrically actuated switches and the plurality of second piezoelectrically actuated switches are independently controllable.

Additional embodiments include a display, wherein the plurality of first piezoelectric switches control the background color of the display, and wherein the plurality of second piezoelectric switches control the color of each of the light sources.

Additional embodiments include a display, wherein the substrate is a flexible substrate, and wherein the display further comprises: a strain gauge in the flexible substrate to monitor deformation of the substrate, and wherein actuation of the plurality of second piezoelectric actuators is at least partially dependent on an output signal from the strain gauge.

What is claimed is:

1. A piezoelectrically actuated switch for modulating a background color in a display, comprising:
    a photonic crystal that has a plurality of blinds oriented substantially perpendicular to a surface of the display, wherein the blinds include a first surface and a second surface;
    an anchor spaced away from an edge of the photonic crystal; and
    a piezoelectric actuator formed on the surface of the anchor and a surface of the photonic crystal.

2. The piezoelectrically actuated switch of claim 1, wherein the blinds are spaced apart from each other by a transparent film.

3. The piezoelectrically actuated switch of claim 2, wherein the blinds have a thickness less than approximately 1 μm.

4. The piezoelectrically actuated switch of claim 3, wherein the blinds have a thickness of approximately 0.1 μm.

5. The piezoelectrically actuated switch of claim 1, wherein the first surfaces of the blinds are black surfaces, and wherein the second surfaces of the blinds are white or reflective surfaces.

6. The piezoelectrically actuated switch of claim 5, wherein the black surfaces are a carbon black filled polymer, and wherein the white surfaces are titanium dioxide.

7. The piezoelectrically actuated switch of claim 1, wherein the first surfaces and the second surfaces are the same color.

8. The piezoelectrically actuated switch of claim 1, further comprising a plurality of photonic crystals each formed adjacent to a pixel of the display.

9. The piezoelectrically actuated switch of claim 8, wherein each photonic crystal is independently controllable.

10. The piezoelectrically actuated switch of claim 1, further comprising:
    a bi- or tri-stable mechanical switch.

11. A piezoelectrically actuated switch for modulating a color of a light source in a display, comprising:
    a piezoelectric layer formed over a substrate;
    a cymbal formed over the piezoelectric layer, wherein a portion of the cymbal is spaced away from a surface of the piezoelectric layer forming a cavity between the cymbal and the piezoelectric layer; and
    a photonic crystal formed over a top surface of the cymbal.

12. The piezoelectrically actuated switch of claim 11, wherein the photonic crystal is a multi-layer polymeric structure.

13. The piezoelectrically actuated switch of claim 12, wherein the multi-layer polymeric structure includes alternating layers of a compliant material and a rigid material.

14. The piezoelectrically actuated switch of claim 13, wherein increasing the thickness of the compliant material changes to the periodic structure and effective bandgap of the photonic crystal.

15. The piezoelectrically actuated switch of claim 11, wherein the photonic crystal is an entropy-coiled polymer chain with a plurality of nanoparticles spaced at regular intervals among the polymer network.

16. The piezoelectrically actuated switch of claim 15, wherein the nanoparticles are gold nanoparticles.

17. The piezoelectrically actuated switch of claim 15, wherein increasing the spacing of the nanoparticles shifts the plasmonic coupling peaks of the photonic crystal.

18. The piezoelectrically actuated switch of claim 11, wherein air is formed in the gap between the cymbal and the piezoelectric layer.

19. The piezoelectrically actuated switch of claim 11, wherein a liquid or soft deformable solid, or semi-solid is formed in the gap between the cymbal and the piezoelectric layer.

20. The piezoelectrically actuated switch of claim 11, further comprising:
    a bi- or tri-stable mechanical switch.

21. A display device, comprising:
  a plurality of light sources formed on a substrate;
  a plurality of first piezoelectrically actuated switches, wherein the plurality of first piezoelectrically actuated switches each comprise:
    a photonic crystal that has a plurality of blinds oriented substantially perpendicular to a surface of the display, wherein the blinds include a black surface and a white surface;
    an anchor spaced away from an edge of the photonic crystal; and
    a piezoelectric actuator formed on the surface of the anchor and a surface of the photonic crystal; and
  a plurality of second piezoelectrically actuated switches, wherein the plurality of second piezoelectrically actuated switches each comprise:
    a piezoelectric layer;
    a cymbal formed over the piezoelectric layer, wherein a portion of the cymbal is spaced away from a surface of the piezoelectric layer forming a cavity between the cymbal and the piezoelectric layer; and
    a photonic crystal formed over a top surface of the cymbal.

22. The display of claim 21, wherein the photonic crystal in each of the plurality of second piezoelectrically actuated switches is a multi-layer polymeric structure or a plasticized polymer chain with a plurality of nanoparticles spaced at regular intervals on the polymer chain.

23. The display of claim 21, wherein each photonic crystal in the plurality of first piezoelectrically actuated switches and the plurality of second piezoelectrically actuated switches are independently controllable.

24. The display of claim 21, wherein the plurality of first piezoelectric switches control the background color of the display, and wherein the plurality of second piezoelectric switches control the color of each of the light sources.

25. The display of claim 21, wherein the substrate is a flexible substrate, and wherein the display further comprises:
  a strain gauge in the flexible substrate to monitor deformation of the substrate, and wherein actuation of the plurality of second piezoelectric actuators is at least partially dependent on an output signal from the strain gauge.

* * * * *